United States Patent
Sneisen

(10) Patent No.: US 9,260,946 B2
(45) Date of Patent: Feb. 16, 2016

(54) POWER CELL FOR DEEPWATER APPLICATION

(71) Applicant: Boerge Sneisen, Hommelvik (NO)

(72) Inventor: Boerge Sneisen, Hommelvik (NO)

(73) Assignee: Siemens Aktiengesellschaft, München (DE)

( * ) Notice: Subject to any disclaimer, the term of this patent is extended or adjusted under 35 U.S.C. 154(b) by 107 days.

(21) Appl. No.: 14/349,379

(22) PCT Filed: Oct. 1, 2012

(86) PCT No.: PCT/EP2012/069319
§ 371 (c)(1),
(2) Date: Apr. 3, 2014

(87) PCT Pub. No.: WO2013/050315
PCT Pub. Date: Apr. 11, 2013

(65) Prior Publication Data
US 2015/0292304 A1    Oct. 15, 2015

(30) Foreign Application Priority Data
Oct. 6, 2011 (EP) .................................... 11184092

(51) Int. Cl.
*H02B 1/01* (2006.01)
*E21B 41/00* (2006.01)
*H01M 6/50* (2006.01)
*H01M 6/42* (2006.01)
(Continued)

(52) U.S. Cl.
CPC ......... *E21B 41/0085* (2013.01); *E21B 41/0007* (2013.01); *H01M 6/42* (2013.01); *H01M 6/5011* (2013.01); *H01M 10/4207* (2013.01); *H01M 10/4257* (2013.01); *H01M 10/4264* (2013.01); *H01M 10/482* (2013.01)

(58) Field of Classification Search
CPC .......... H05K 7/20; H05K 7/207; B60K 6/00; B60K 6/04; B60K 6/28; B60K 6/30; B60K 6/46; G01N 29/04
USPC ................... 361/830, 679.58, 690, 694, 707; 228/1.1, 8; 454/184; 307/11, 31, 53, 307/64, 66, 150
See application file for complete search history.

(56) References Cited

U.S. PATENT DOCUMENTS 5,166,677 A    11/1992 Schoenberg
5,388,030 A *  2/1995 Gasser ................. H05K 7/1477
                                                174/350
(Continued)

FOREIGN PATENT DOCUMENTS

| EP | 1113570 A1 | 7/2001 |
| WO | 2008125135 A1 | 10/2008 |
| WO | 2011008514 A2 | 1/2011 |

OTHER PUBLICATIONS

PCT International Search Report and Written Opinion of the International Searching Authority dated Nov. 7, 2012 for corresponding PCT/EP2012/069319.

*Primary Examiner* — Xiaoliang Chen
(74) *Attorney, Agent, or Firm* — Lempia Summerfield Katz LLC

(57) ABSTRACT

The embodiments describe a power cell for deepwater application including an power cell housing, a capacitor bank, an electronic module, and input/output connectors, wherein the power cell housing is essentially made of an insulating material. The embodiments further describe a power cell system including a number of power cells, a frame for supporting the power cells, and electric connections, in particular, a busbar arrangement for connecting to the power cell.

17 Claims, 8 Drawing Sheets

(51) Int. Cl.
*H01M 10/42* (2006.01)
*H01M 10/48* (2006.01)

(56) References Cited

U.S. PATENT DOCUMENTS 5,640,061 A * 6/1997 Bornhorst .............. H05B 37/02
 307/11
5,828,554 A * 10/1998 Donegan ................ B60K 6/28
 180/65.1
2007/0048561 A1 3/2007 Aiello et al.
2010/0127371 A1* 5/2010 Tschirbs ................. H01L 23/13
 257/684
2013/0032310 A1* 2/2013 Jaena ..................... F28D 15/02
 165/104.25

* cited by examiner

POWER CELL FOR DEEPWATER APPLICATION

CROSS-REFERENCE TO RELATED APPLICATIONS

The present patent document is a §371 nationalization of PCT Application Serial Number PCT/EP2012/069319, filed Oct. 1, 2012, designating the United States, which is hereby incorporated by reference, and this patent document also claims the benefit of EP 11184092.2, filed Oct. 6, 2011, which is also hereby incorporated by reference.

TECHNICAL FIELD

The embodiments relate to power cells for deepwater application, including a power cell housing, a capacitor bank, an electronic module, and input/output connectors. The embodiments further relate to power cell systems including a number of power cells.

BACKGROUND

Deepwater (also called subsea) processing is becoming more relevant in the field of oil and gas recovery, since deposits located below the ocean floor may often be made accessible by those techniques only. Therefore, it is necessary to adapt equipment for long step-outs (e.g., long distances), marginal and dispersed oil or gas fields, and for the high-pressure conditions of deep water. In the last years, large-scale seabed facilities for use in deep water were developed. Deepwater facilities may be designed to be operated for long step-outs with total reliability withstanding extreme pressures and temperatures. "Deepwater" is to be understood to describe situations of 300 meters and deeper, such as, in some embodiments, about 2,000 meters and deeper, or about 3,000 meters.

Deepwater processing facilities may include several electrically driven pumps and/or gas compressors to transport oil and gas over very long distances. Such pumps and compressors are driven by variable-speed or variable-frequency drives. The variable-speed drive may be connected to or part of a subsea power grid system via which the drive receives electric power for operation, or the drive may be directly supplied with electric power from an onshore power plant or an offshore platform, e.g. via an umbilical or sea cable. The variable-speed drive may be encapsulated in a pressure-resistant outer housing realizing an atmospheric environment, (e.g., an internal pressure of about 1 atmosphere), for the components of the variable-speed drive. The variable speed drives may have a complex design may not be easily scalable, and due to the atmospheric operation, may require an enclosure of considerable size and weight since the enclosure walls need to withstand pressure differences of up to 300 bar. This results in high production, transportation, and installation costs.

Conventional on-land variable-speed or variable-frequency drives may include a number of power cells arranged in a power cell system. Such power cells may be adapted for the application in medium-voltage or high-voltage variable-speed or variable-frequency drives. Medium-voltage may refer to a rated voltage greater than 690 volts (V) and less than 69 kilovolts (kV). Sometimes medium voltage may be a voltage between about 1000 V and about 69 kV. In many such systems, modular power cells are used. High voltage ratings exceed such medium voltage ratings, e.g., voltage ratings greater than about 69 kV.

The power cells used in conventional on-land variable-speed or variable-frequency drives may include one or more three-phase diode-bridged rectifiers, one or more direct current (DC) capacitors, and one or more H-bridge inverters as disclosed, for example in U.S. Patent Publication No. 2007/0048561 A1 for variable-frequency drives. The rectifier converts the input alternating current (AC) voltage to an essentially constant DC voltage that is supported by the capacitors that are connected across the rectifier output. The inverter transforms the DC voltage across the DC capacitors to an output using pulse-width modulation of the semiconductor devices in the H-bridge inverter.

SUMMARY AND DESCRIPTION

The scope of the present invention is defined solely by the appended claims and is not affected to any degree by the statements within this summary. The present embodiments may obviate one or more of the drawbacks or limitations in the related art.

It is an object of the embodiments to provide a simple power cell and power cell system increasing the lifetime and reliability of the power cells under deepwater application, and reducing the overall costs for such power cells and power cell systems.

According to the embodiments, the power cell for deepwater application includes a power cell housing, a capacitor bank, an electronic module, and input/output connectors. For the sake of simplicity, the number of capacitor banks and electronic modules is not specified, but the terms "capacitor bank" or "electronic module" provide that one or more capacitor banks or electronic modules may be present in one power cell. In addition, if more capacitor banks or electronic modules are present, those may be the same or different components.

According to the embodiments, the power cell housing is essentially made of an insulating material. "Essentially made of an insulating material" provides that most of the parts of a power cell housing, (e.g., the housing except some parts such as heat exchangers, electrical connectors, etc.), is made of an insulating material. The advantage of an insulating material for the power cell housing is that the power cell housing itself functions as an electrical insulator against external systems such as a power cell frame or another power cell in a power cell system including more than one power cells. Another power cell may be, for example, a power cell arranged next to the corresponding power cell in a row or a line of several power cells.

Insulating power cell housings may be constituted of any insulating material as long as the material is stable in the respective environment to which the power cell is exposed. The insulating materials may be polymeric materials such as materials including polyoxymethylene (POM), polypropylene (PP), or the like.

In contrast to conventional power cells, the power cells that include insulating power cell housings are safer and more reliable when being used in a power cell system including a supporting frame such as a metallic frame that may be used in the prior art solutions for constructional reasons. In particular, an additional insulating member such as a bar or a mat or a blanket for the insulation against the metallic frame for supporting the power cells is not needed because the power cell housing functions as an insulating member itself. Thus, the number of components of a power cell system may be decreased when using the power cells of the embodiments in contrast to conventional power cells.

In order to realize a power cell for deepwater application, any components, such as the capacitor bank and/or the electronic module in the interior of such a power cell may be specifically adapted to a pressurized environment because of the high deepwater pressure that acts not only on the exterior of the power cell but also in the interior of the power cell. Thus, the power cell components that are exposed to high pressure and optionally dielectric fluids may be tested and qualified according to relevant standards (e.g., DNV-RP-A203 "Qualification procedures for new technology"). In particular, the components may for example be tested in pressure vessels at 1.5×300 bars. The pressure vessels are filled with the relevant dielectric fluid to investigate if the function of the components in those harsh environments is the same as in atmospheric environment.

According to the embodiments, a power cell system is further provided that includes a number of such power cells that are configured to be replaceable, a frame for supporting the power cells, and electric connections, in particular, a busbar arrangement, for connecting to the power cells. The power cell system is specifically adapted to deepwater applications because the power cell system may be arranged in an outer housing encapsulating the power cell system. "Encapsulating" provides that the power cells of the power cell system are placed in a dielectric environment.

Optionally, the power cell system contains pressure-exposed power cells in order to simplify the constitution as an outer housing providing an atmospheric pressure environment may be omitted. Accordingly, the power cell system is not in an atmospheric pressure environment, but the power cell system is held in a pressurized environment. "Pressurized environment" provides that the internal pressure is similar to the external pressure, for example, the deepwater pressure at the seabed conditions.

In an embodiment of the power cell, the power cell includes a hermetically sealed structure. "Hermetically sealed structure" provides that the power cell housing entirely encapsulates the inner components and parts of the power cell so that components, fragments, or parts of the components of the interior of the power cell are retained inside the power cell housing if a capacitor bank or an electronic module might be damaged. Therefore, it is possible to keep the whole system operational in the event of a failure of one or more power cells of a power cell system because the other power cells, such as the power cells directly or indirectly next to the damaged power cell(s), are not affected by such a failure.

In certain embodiments, the power cell may include a pressure compensation system. Such a system allows a quick and easy compensation of the internal pressure of a power cell to the pressure of the power cell's external or surrounding environment. Therefore, if the pressure increases in the environment of such a power cell, for example due to an increasing pressure caused by sinking of the power cell into even deeper water, the system allows a compensation of the internal pressure to a pressure similar to the external pressure acting on the power cell. "Similar pressure" provides that nearly the same or only a slightly different pressure is used in the interior and the exterior of the power cells. In some embodiments, it may be favorable if a small overpressure is present inside a power cell in order to stabilize the construction of the power cell housing.

Examples of such pressure compensation systems may be a bellows or a bladder that is placed inside the power cell housing to compensate for the volume difference that occurs during pressure and/or temperature variation. It is possible that the pressure compensation system has an opening to the exterior of a power cell so that the fluid flowing around the power cell may flow into the pressure compensation system. An overpressure on the exterior of a power cell may be compensated by drawing some fluid into the pressure compensation system through the opening. For example, some fluid may be pushed into a bladder inside the power cell, thereby decreasing the space in the power cell. Thus, the pressure inside the power cell will be increased due to the reduction in space.

The pressure compensation system may include a number of openings in the power cell housing for regulating the pressure in the interior of the power cell housing according to the ambient pressure. The openings may allow the intrusion of external fluid into the internal of the power cell so that the pressure in the interior and the external of the power cell is kept balanced, e.g., is almost equal. This is a way for pressure compensation while maintaining the hermetic sealing of the housing. The size of the openings may be within about 1 mm to about 10 mm or within about 1 mm to about 5 mm. The openings may be designed such that the openings allow compensation of the pressure between the interior and the exterior of the power cell housing. In this configuration, additional components of a pressure compensation system are not necessarily needed. Of course, the openings may be combined with additional pressure compensation systems as described in the paragraph before.

In a further embodiment of the power cell, a number of openings realized to allow circulation of a cooling fluid through the interior of the power cell are included in the power cell housing. The openings may be located in the bottom and the top of a power cell so that the fluid is allowed to flow through the interior of the power cell. In this embodiment, the openings may be large openings having a size of more than about 10 mm, or more than about 50 mm. In a particular embodiment, the opening may encompass at least part of, or the entire bottom and/or top of the power cell housing. In this configuration, an additional pressure compensation system may be omitted because of the size of the openings. The reason is that the size of the openings is so large that the interior and the exterior are directly connected with each other so that, at any time, the interior of the power cell has a pressure similar or equal to the ambient pressure.

The opening(s) of the power cell may include(s) a filter. The filter may be a filtering mesh or any other filter made of a specific material so that components or fragments or parts of the interior components may be filtered and/or hindered on being transported to the exterior of a power cell if a component inside the power cell should explode or otherwise fail. If the openings are covered with such a filter, a contamination of the fluid surrounding the power cells and/or the neighboring power cells with fragments or parts of a broken cell component may easily be avoided.

The power cell may include a heat exchanger for cooling the interior of the power cell, in particular, the electronic modules such as the semiconductors (e.g., insulated-gate bipolar transistors or IGBTs). A heat exchanger may be an active heat exchanging system or may be a passive system like a heat sink protruding through the power cell housing. Thereby, the heat exchanger is arranged in a part of the power cell housing. The heat exchanger allows the reduction of the temperature in the power cell interior by actively or passively delivering the heat to the exterior of the power cell. By cooling the exterior of the heat exchanger actively or passively, the temperature in the interior of the power cell may be simultaneously reduced. In one embodiment, the electronic modules, in particular, the semiconductors, may be mounted directly to the heat exchangers, (e.g., are provided with heat sinks), to make the cooling of these components most effective.

The power cell may include a number of electronic modules. As the interior of the power cells may be pressurized at about the same pressure as the ambient environment, (e.g., at about 3,000 meters under water), all the electronic components need to withstand such high pressures.

According to an embodiment of the power cell system including a frame for supporting a number of replaceable power cells as explained above in detail, the system may include a cooling system for the power cell(s). The cooling system may be a passive cooling system such as a heat exchanger or an active cooling system such as a fan or the like.

An example of a passive cooling system may be a convection cooling system using a fluid. "Convection cooling system" refers to a system in which a cooling fluid, such as an inert fluid, circulates through the power cell system thereby cooling the power cell(s). The circulation of the cooling fluid is driven by a convection mechanism in which the temperature of the fluid is increased at the warmer parts of the power cell(s). The heated fluid will be then cooled at the colder parts of the power cell system, in particular, the outer housing that may be cooled by the external cold water surrounding the power cell system. At those parts of the power cell system, the fluid circulates from the power cell parts with higher temperature to the parts of the power cell system having a lower temperature and, after the cooling of the fluid, back to the region with higher temperatures.

Suitable fluids to be used in power cell systems are inert fluids such as dielectric fluids. Dielectric fluids do not cause short circuits in the power cells, even though the fluid is directly in contact with components of the power cell or the power cell system. Examples of such dielectric fluids may be silicone oils, mineral oils, or ester-based polymer fluids. The advantage of such fluids is that their density may be reduced with increasing temperature. The fluid properties may be used to induce a rising free convection flow. The colder walls of the outer housing will have the opposite effect on fluid density, inducing a falling free convection flow. The circulating flow will provide the heat transport necessary to provide sufficient cooling of the power cells, in particular, the power cell components generating high amounts of thermal energy such as the capacitors and the electronic modules.

According to a variation or a further embodiment, the power cell system may include an outer housing around the mounting frame and the power cells. The outer housing is specifically adapted for deepwater application. For example, the outer housing prevents water from entering the power cell system. The outer housing has the function of encapsulating the power cell system components from the environment, such as from the surrounding sea water. An additional function of the outer housing may be to withstand the pressure of the surrounding deepwater environments, for example, pressures of more than 300 bar or more.

Optionally, the outer housing allows a compensation of the pressure between the interior and the exterior of the power cell system so that the internal pressure of the power cell system is similar or almost equal to the external pressure of the power cell system. Hence, during deepwater application, the power cell system may be in a pressurized state. This allows for a simpler construction of the power cell system because additional pressure compensation systems, as conventionally used in under-water applications, are not necessary.

The outer housing around the power cell system may include a volume compensation system for the total power cell system. This system allows a compensation of pressure and temperature differences between the exterior and the interior of the outer housing that will occur during storage, transportation, installation, and retrieval of the power cell system. In other words, the pressure inside the power cell system will be kept almost equal to the ambient pressure, e.g., the pressure of ambient sea water. The volume compensator may for example include a flexible element, such as a bellow, a membrane or a bladder, which transmits the ambient outside pressure to the inside of the outer housing and allows for volume changes of the dielectric fluid inside the outer housing. Such power cells and power cell systems are for example applicable in deepwater power grid systems, in particular, in variable speed drives, for example in systems for recovering of oil and/or gas from extreme depths or compressing gas in these depths.

A further embodiment provides a subsea variable speed drive including a power cell system in any of the above configurations.

An embodiment of the power cell system for subsea or deepwater applications is described in the following. The power cell system includes a number of power cells, a frame for supporting the power cells, and an outer housing around the mounting frame and the power cells, wherein the whole system is adapted for deepwater applications. The power cells, the frame, and the outer housing may be embodied in the same manner as described in the aforementioned embodiments.

Each power cell of the power cell system separately includes a power cell housing that is made of an insulating material, a capacitor bank, an electronic module, and input/output connectors.

In order to withstand the high pressures in deepwater applications, the frame may be at least partially made from a metallic material, while other non-metallic materials with a suitable rigidity may be used as well. If the power cell system further includes electric connections for connecting the input/output connectors of the number of power cells, the frame may support the electric connections.

According to a further embodiment, the outer housing may be at least partly filled with a dielectric fluid, in particular, a dielectric liquid. "At least partly filled" provides that the amount of fluid is adapted such that the dielectric fluid may be used for generating a counter-pressure against the inner side of the housing to adapt the power cell system for deepwater applications. Additionally, the fluid may be used to prevent water from entering into the power cell system. The pressure rise outside the outer housing of the power cell system during moving the system to the seabed and the difference between the internal and external pressures may be equalized by a volume compensation system for equalizing the pressure as described before in detail. The fluid inside the outer housing may be used to assist in generating a respective counter-pressure inside the outer housing. For this purpose, it is suitable to use less or non-compressible dielectric fluids, such as fluids in the form of a solution or gel, for generating the counter-pressure at a relative large internal volume of the total power cell system. The dielectric fluid may for example be a liquid such as silicone oil, transformer oil, or the like.

Additionally, the power cell system optionally includes a cooling system for the power cells that may be embodied as described before with regard to the embodiments.

This power cell system is specifically adapted to withstand high pressures in deepwater applications, such as in conditions with high pressures present, for example, in more than 200 meters under the normal sea-level. For example, the power cells, the frame and the outer housing are adapted to these harsh conditions.

Features of the above aspects and embodiments may be combined unless noted to the contrary.

DETAILED DESCRIPTION

Figure 1:
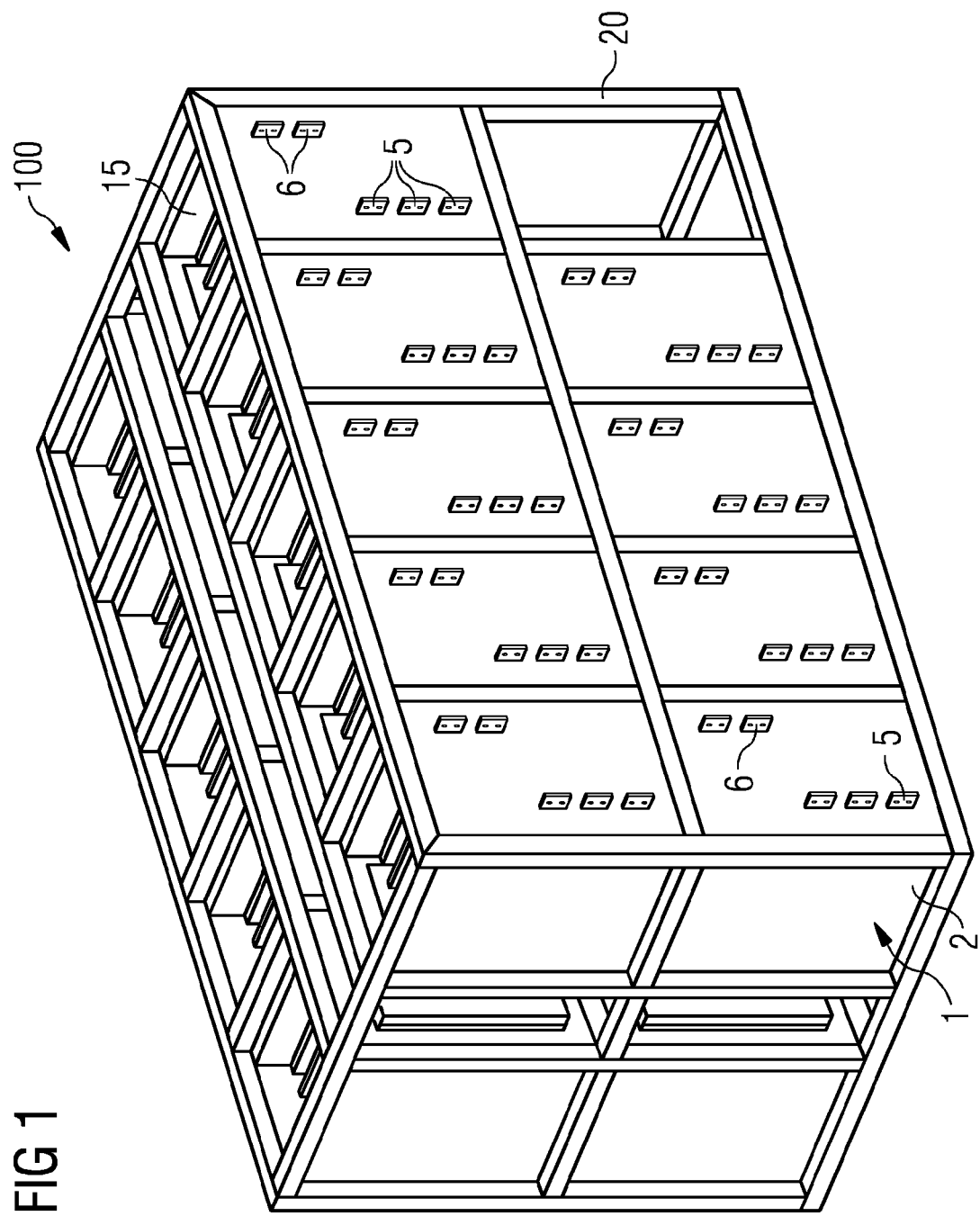
FIG. 1 depicts a perspective view of an embodiment of parts of a power cell system including a number of power cells mounted in a frame.

FIG. 1 depicts a perspective view of a power cell system 100 for deepwater application including a number of power cells 1 and a frame 20. The system 100 is adjusted for deepwater application because of the specific construction of the power cells 1. Each power cell includes an insulating power cell housing 2, input connectors 5, and output connectors 6. The power cell housing 2 of the power cells 1 has an opening 15 at the top of the power cell 1.

As depicted in FIG. 1, the metallic frame 20 has, on each of the frame's two sides, two rows and five lines of power cell storage positions. In total, the frame 20 as exemplified in FIG. 1 has positions for twenty power cells 1. Of course, frames with less or more power cell storage positions may be constructed without departing from the embodiments. In addition, alternative arrangements of the power cells 1, for example in separated lines and rows or in a cylindrical form may be used as well. At each place, a power cell 1 may be mounted. The power cells 1 may be mounted such that the power cells may easily be removed for maintenance or replacement.

The power cell housing 2 of each of the power cells 1 is made of an insulating material. Thus, each power cell 1 is electrically insulated against the metallic frame 20 supporting the power cells. Additionally, the insulating power cell housing 2 allows an electrical insulation of each power cell from the surrounding power cells as well.

Figure 7:
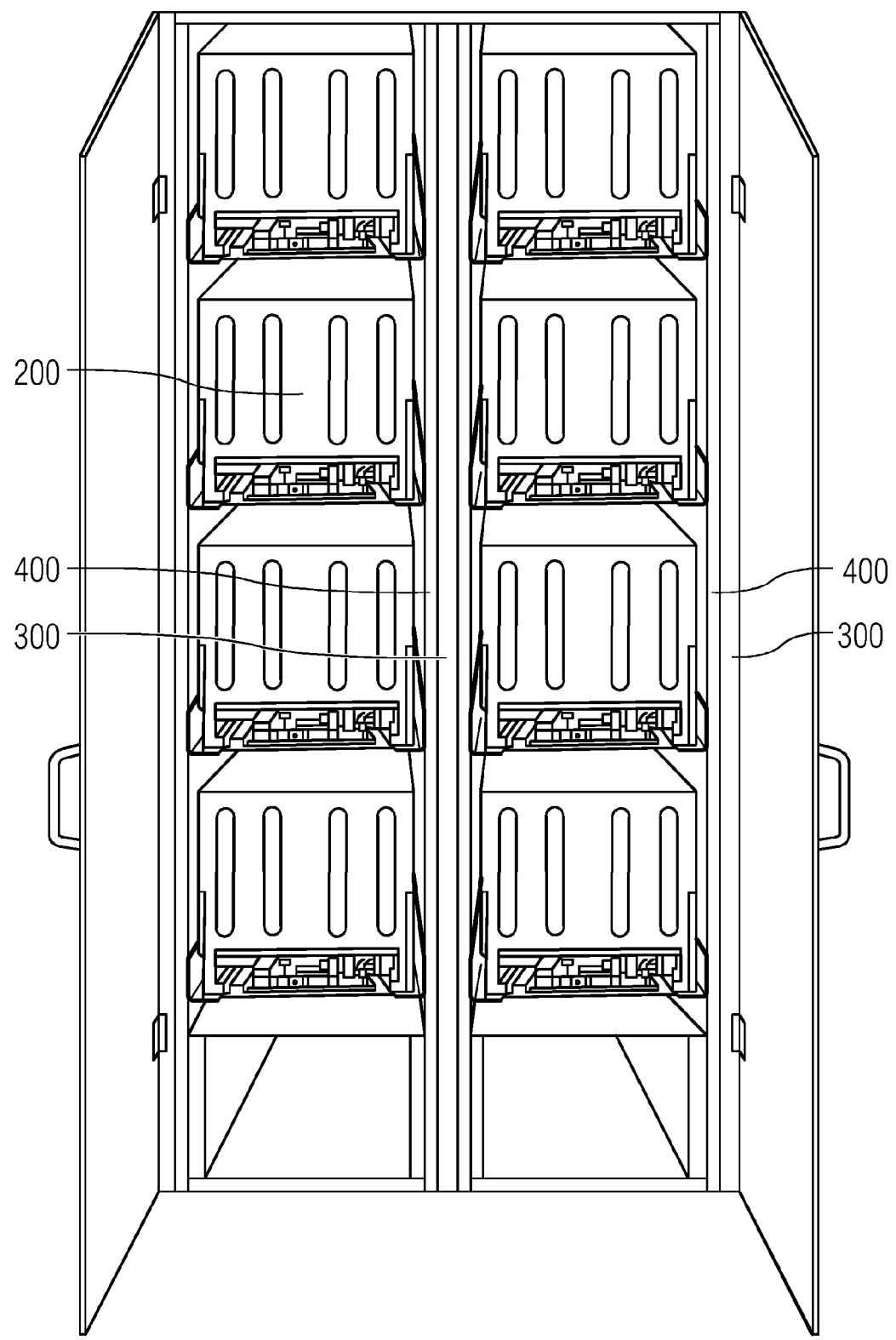
FIG. 7 depicts a front view of a prior art power cell system for on-land use.
Figure 8:
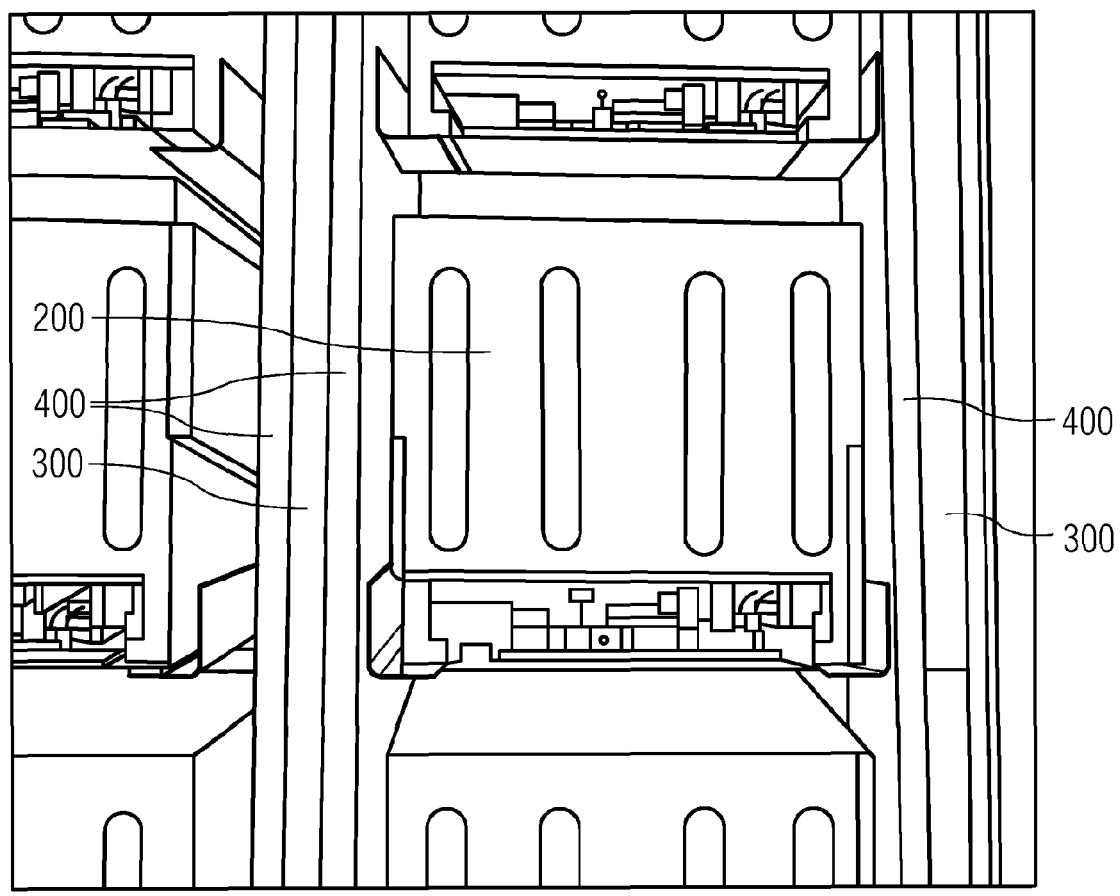
FIG. 8 depicts an enlarged view of the prior art power cell system of FIG. 7.

The power cells 1 having an insulating power cell housing 2 are advantageous over the prior art power cells 200 as depicted in FIGS. 7 and 8 because the power cells do not require any additional insulating material 400 between the housing of a power cell 200 and the mounting frame 300. Conventionally, the electrical insulation to the metallic frame and the surrounding power cells is made with a mat or layer made of an insulating material. It is thus possible to make the power cells simpler and cheaper because additional insulating elements as used in the conventional power cells are not needed. Moreover, it is easier to replace the power cells because the power cells 1 may be directly mounted into the frame 2.

The power cells 1 as depicted in FIG. 1 include input connectors 5 and output connectors 6. The input/output connectors 5,6 are arranged at one side of each power cell 1 such that the connectors may easily be connected with a busbar arrangement of a power cell system for electrically connecting the connectors with the other electronic parts of the power cell system.

In FIG. 1, power cells 1 are depicted having an opening 15 at the top side of the insulating power cell housing 2. The opening is arranged such that the opening has a specific distance to each metallic part of the frame 2 or the surrounding power cells 1. Hence, even though there is no insulting material at the part of the opening, the power cell 1 is electrically insulated against the frame 20. At the base of the power cell housing 2, a respective opening may be provided as well. The openings may be used to cool the internal components of the power cell 1, such as the capacitor banks, by a cooling fluid flowing through the internal of the power cell 1.

Figure 2:
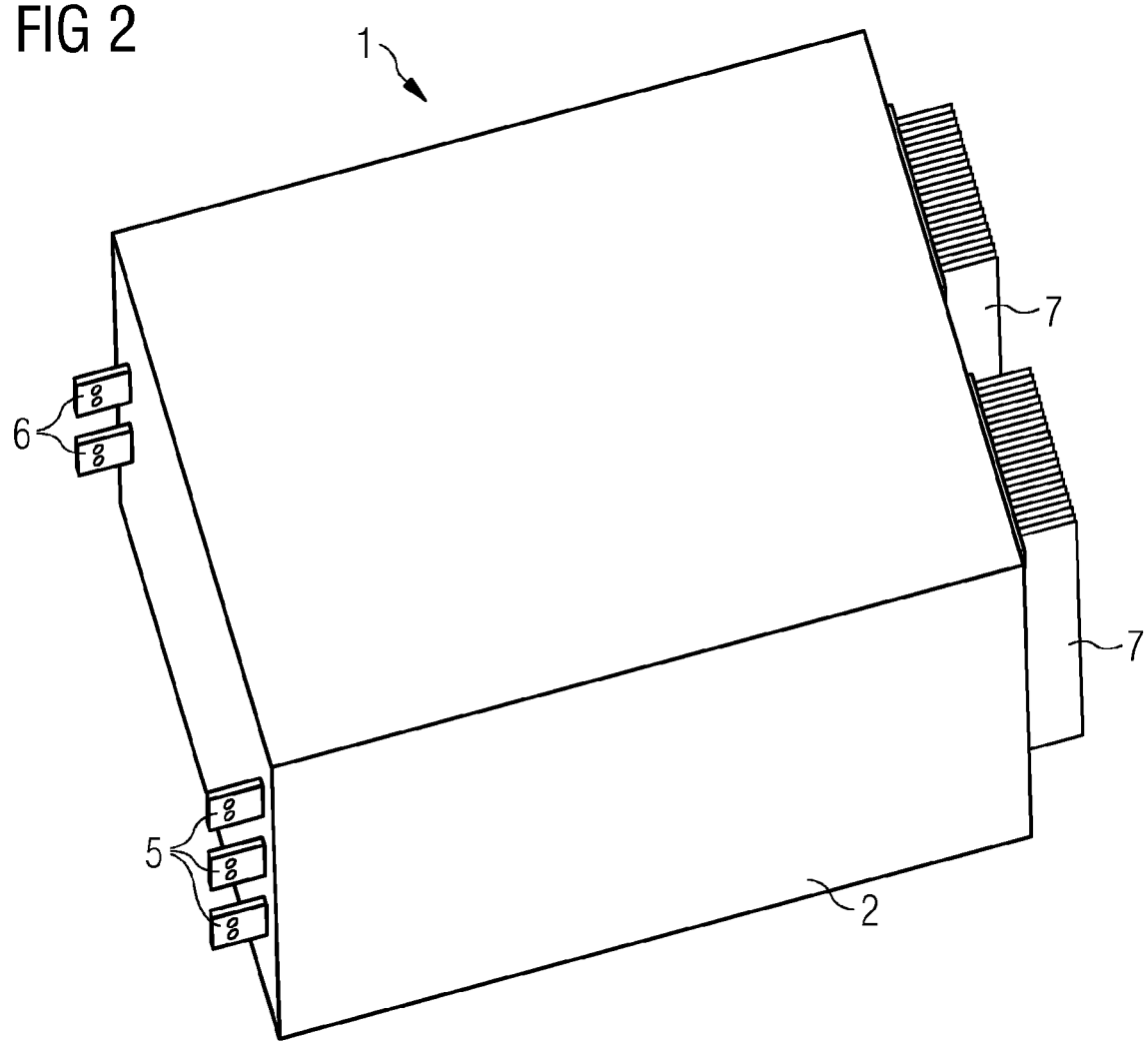
FIG. 2 depicts a perspective view of an embodiment of a power cell.

FIG. 2 depicts a perspective view of a first embodiment of a power cell 1 including a power cell housing 2, input and output connectors 5,6, and a heat exchanger 7. The power cell housing is made of an insulating material to provide an electrical insulation against the surrounding parts of a power cell system such as, for example, a frame or surrounding power cells. The power cell housing 2 according to this embodiment is provided such that the internal of the power cell is hermetically sealed against the environment. Thus, the components of the power cell in the power cell's interior compartment are protected against any contamination that may be caused due to failure of a surrounding power cell. In addition, in case of failure of such a power cell 1, the components or fragments of those components in the interior of a power cell would be retained in the hermetically sealed housing, thus avoiding any contamination on the exterior of this power cell.

As the inner components of a power cell, such as the electronic modules and the capacitor banks, generate heat during operation, it may be possible to cool the interior of a hermetically sealed power cell. For such a cooling operation, one or more heat exchangers 7 may be provided in a part of the power cell housing 2. "Provided in the power cell housing" provides that a first part of the heat exchanger is provided outside the housing wherein a second part is provided inside the power cell housing. The first and the second parts are connected with each other in such a manner that the generated thermal energy may be transported from the interior to the exterior of a power cell. To allow such a transport of thermal energy the first part provided outside the power cell is cooled in such an extent as thermal energy is generated inside the power cell, such as at the electronic modules (e.g., insulated-gate bipolar transistors). The external part of the heat exchanger 7 may be a heat sink that transfers thermal energy from a higher temperature generated within a solid material to a lower temperature fluid medium. Examples of such heat sinks are active or passive components that may include a base and a number of fins. The fins are responsible for increasing the surface area responsible for the energy transfer. For additionally increasing the heat transfer rate, an active cooling element such as a cooling fan or the like may be provided at the fins. Alternatively, the fins may be arranged such that a convective flow of the cooling fluid between the fins is not hindered. A convective flow of the cooling fluid is supported if the fins are substantially vertically provided.

Figure 3:
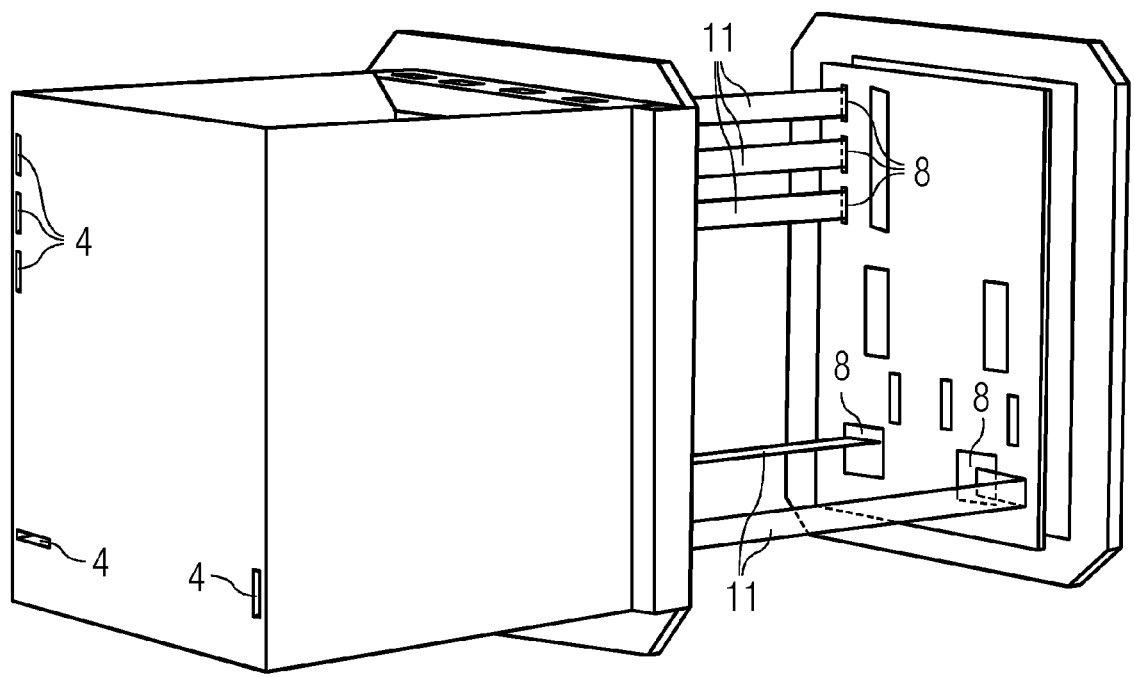
FIG. 3 depicts an exploded view of a variation of a power cell of the embodiment similar to that of FIG. 2.

FIG. 3 depicts an exploded view of a variation of a power cell 1 according to the first embodiment. This power cell 1 includes a power cell housing 2, openings for the input/output connectors 4, and electronic modules 8. In FIG. 3, the connectors are not depicted because the connectors were drawn back into the internal of the power cell housing by opening the power cell. The connectors are located at the end of the internal bus busbars 11 (partly depicted in FIG. 3) that are connected with the electronic modules 8. The internal busbars may include a material with high conductivity to allow a good connectivity between the electric modules and the input and output connectors, respectively. In operational state, the internal busbars 11 and the electronic modules 8 are encapsulated in the hermetically sealed power cell housing. In the main part of the power cell housing, capacitor banks are provided.

In order to be adapted for deepwater application, a pressure compensation system may be provided in the power cell housing. Thus, each power cell of a power cell system has its own pressure compensation system so that the external of the power cells may be set at a pressure of the environment, for example, the pressure existing in deepwater conditions at the seabed. The advantage is that the whole power cell system does not need to be put at a pressure of one atmosphere as in conventional systems.

Figure 4:
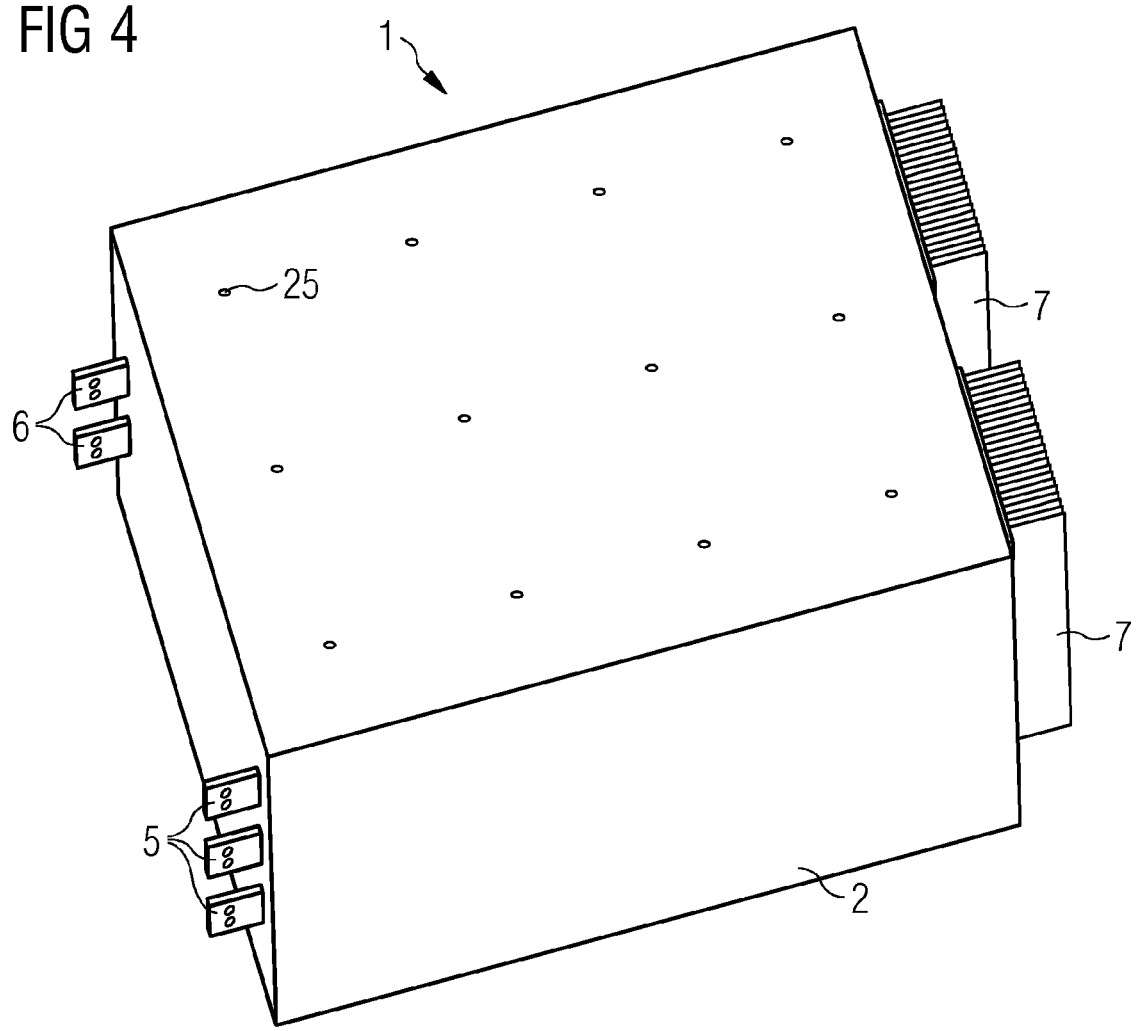
FIG. 4 depicts a perspective view of an embodiment of a power cell.

FIG. 4 depicts a perspective view of a second embodiment of a power cell 1 including a power cell housing 2, input and output connectors 5,6, a heat exchanger 7 (only the external parts are depicted), and small openings 25.

The power cell housing 2 may be made of an insulating material and the connectors 5,6 and the heat exchanger 7 are at the same location as in the first embodiment. The difference to the first embodiment is the provision of openings 25 at the top and/or bottom of the power cell housing. These openings are small through-holes extending through the power cell housing 2 to allow a compensation of the pressure inside the power cell housing to a pressure present in the environment of the power cell 1. The size of the openings is small so that the power cell housing is considered to be almost tight. Thus, in the event of failure of the power cell, most of the components or fragments thereof are retained in the power cell housing. The openings 25 are large enough for pressure compensation. Of course, even though the small openings are provided in the substantially tight power cell housing, the power cell according to this embodiment may have an additional pressure compensation system as well.

Figure 5:
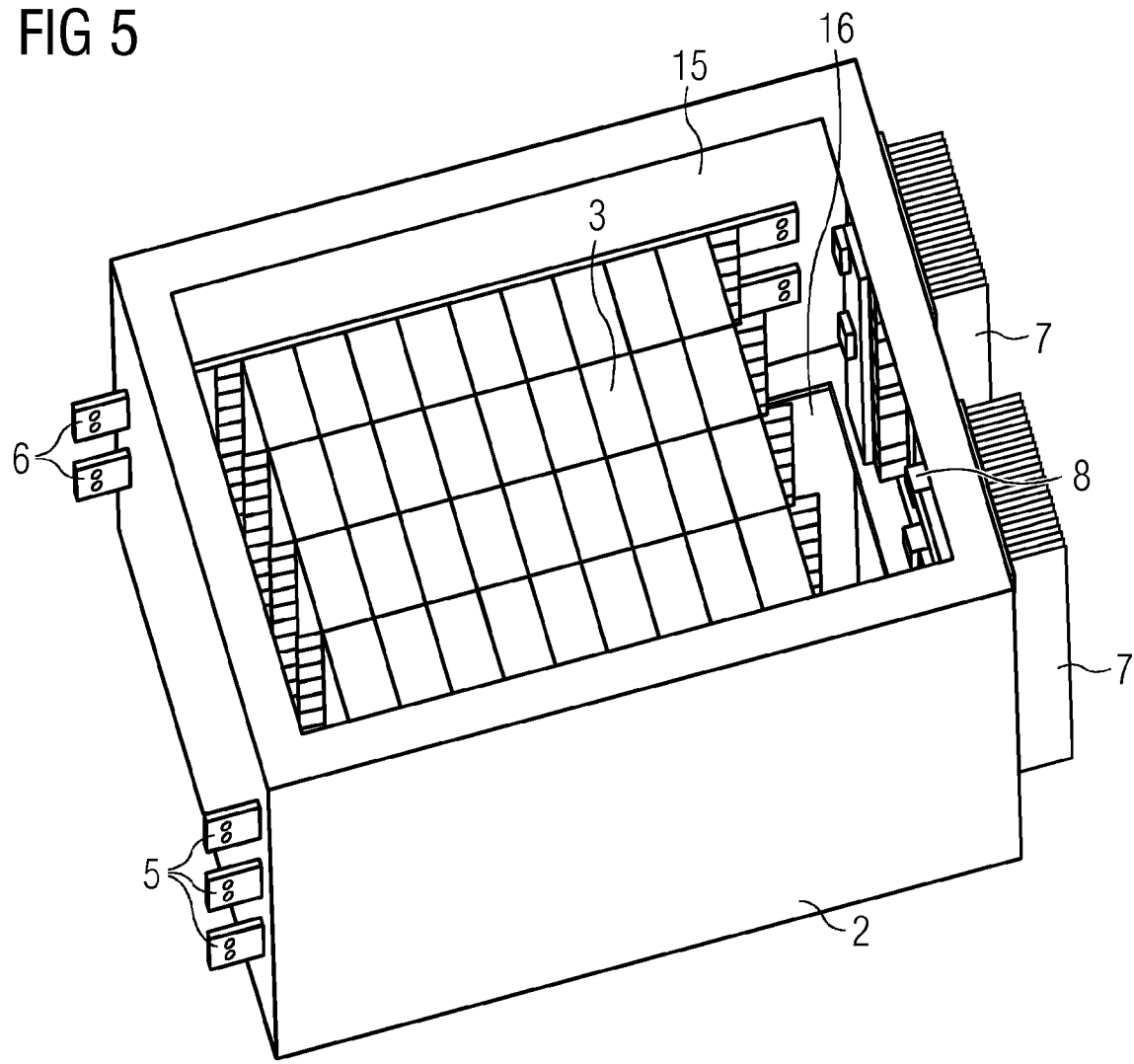
FIG. 5 depicts a perspective view of an embodiment of a power cell.

FIG. 5 depicts a perspective view of a third embodiment of a power cell. The power cell includes a power cell housing 2, capacitor banks 3, input and output connectors 5,6, a heat exchanger 7, electronic modules 8, and openings 15,16 at the top and the bottom of the power cell.

According to this embodiment, the openings 15,16 extend over the total area of the top and bottom of the power cell housing 2. The advantage of this arrangement is that a cooling fluid may freely flow through the interior of the power cell 1. Thus, a pressure compensation system is not needed because the pressure on the interior is the same as the pressure on the exterior of the power cell. The openings may be covered with a filter such as a filtering mesh to keep the components and broken fragments thereof inside the power cell after a break of the power cell. A contamination of the fluid at the external side of a power cell with components or fragments of a broken power cell may substantially be avoided or at least hindered by such a filter.

As the filter at the top and bottom side of the power cell housing is not depicted in FIG. 5, the internal components are visible. A number of capacitor banks 3 are arranged in several rows and lines in the main parts of a power cell 1. The capacitor banks 3 are directly connected to the electronic modules 8 wherein these connections are not depicted in FIG. 5 for the sake of a better understanding.

The input and output connectors 5,6, the heat exchanger 7, and the electronic modules 8 with the internal busbars 11 in the power cell 1 are the same as in the first and second embodiment. Therefore, with respect to a detailed explanation of these components we refer to the explanations beforehand.

Figure 6:
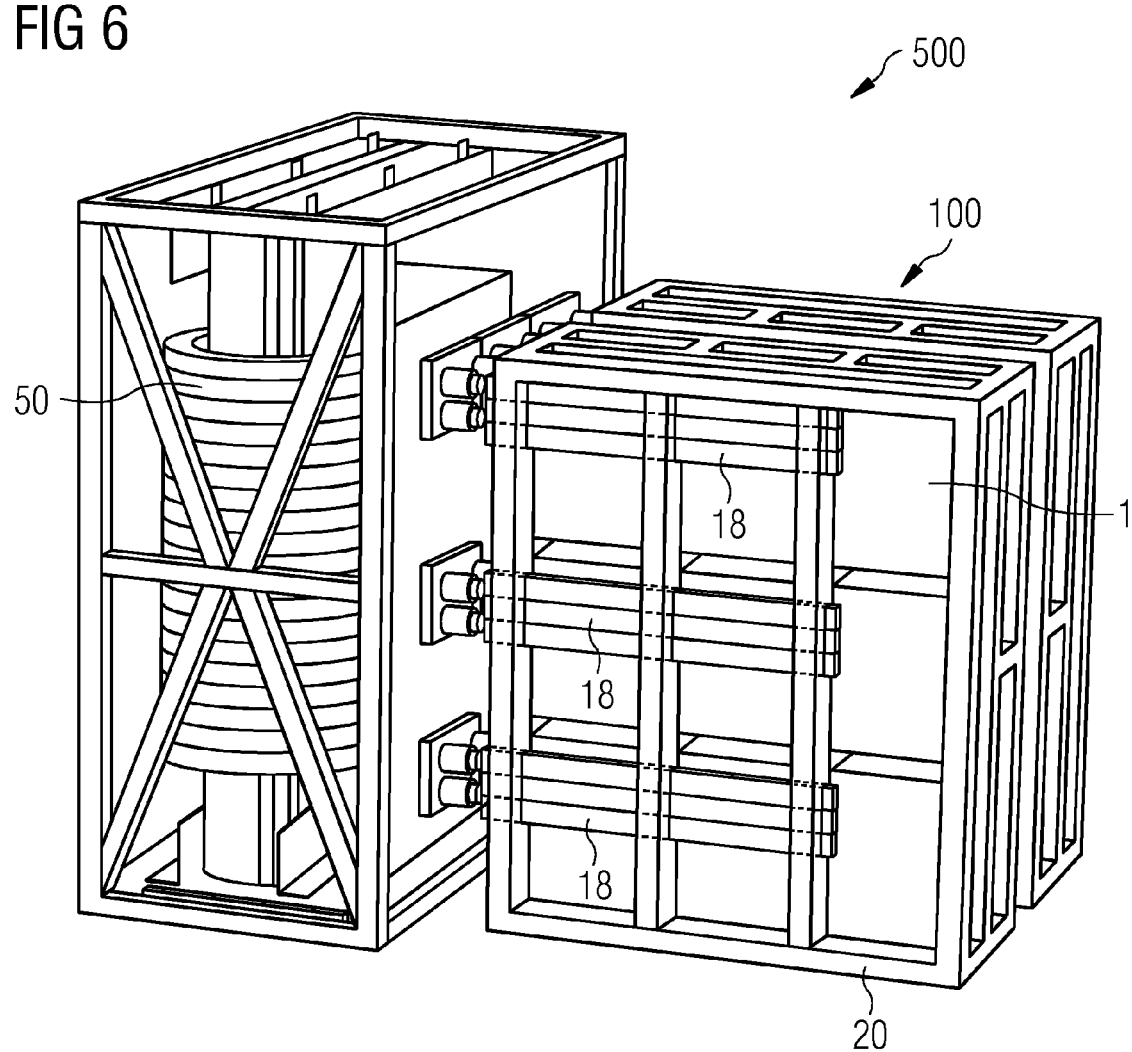
FIG. 6 depicts a perspective view of an embodiment of parts of a variable-speed drive in which power cells depicted in FIG. 3 are used.

In FIG. 6, a perspective view of parts of a variable-speed drive 500 for deepwater application is depicted in which a power cell system 100 as depicted in FIG. 1 is used. The power cell system 100 is depicted at the right side in FIG. 6 including a number of power cells 1 according to the first embodiment, a metallic frame 20, and a busbar arrangement 18. The busbar arrangement 18 connects the input and output connectors of each of the power cells with each other. The collected inputs and outputs are connected to the transformer unit 50. Hence, the power cell system 100 is a separate system that may be used in a pressurized atmosphere because each power cell 1 is adapted for deepwater application. Thus, the power cell system 100 may be made simpler and does not need the encapsulation of the power cell system in a housing that provides an environment of one atmosphere in the interior of the power cell.

In FIG. 7, a front view of a prior art power cell system for on-land use is depicted, wherein a number of power cells 200 are supported in a metallic frame 300. As the power cell housing is made of a metallic material, an insulation material 400 in the form of a mat is arranged between the power cell housing and the frame 300. The insulation material is necessary to insulate the power cells 200 against the metallic frame for supporting the power cells.

FIG. 8 depicts an enlarged view of the prior art power cell system of FIG. 7. As may be seen from this figure, the power cells have a power cell housing with several openings to allow a cooling fluid or a gas, flowing through the power cells. However, as may be easily estimated from this figure, the conventional power cells are not suitable for being used under a pressurized atmosphere because the electric modules and the other parts of the power cells are not suitably protected against damages and short circuits under such extreme conditions.

It will be understood that numerous additional modifications and variations may be made thereto without departing from the scope of the embodiments. While the variable-speed drive was used as a basis for the description, the power cells may be used to good effect in subsea applications other than variable-speed drives. For example, the power cells may be used, for example, in motors for subsea vehicles or in subsea power plants as well, etc. For the sake of clarity, it is to be understood that the use of "a" or "an" throughout this application does not exclude a plurality, and "comprising" does not exclude other acts or elements. A "unit" or "module" may include a number of units or modules, unless otherwise stated.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A power cell system for deepwater application comprising:
    a number of power cells, each power cell of the number of power cells comprising a power cell housing, a capacitor bank, an electronic module, and input/output connectors;
    a mounting frame for supporting the number of power cells; and
    an outer housing around the mounting frame and the number of power cells;
    wherein the power cell housing for each power cell of the number of power cells is made of an insulating material, and
    wherein the mounting frame is at least partially made from a metallic material.

2. The power cell system according to claim 1, further comprising electric connections for connecting the input/output connectors of the number of power cells.

3. The power cell system according to claim 2, wherein the mounting frame supports the electric connections.

4. The power cell system according to claim 1, wherein the outer housing is at least partly filled with a dielectric fluid.

5. The power cell system according to claim 1, further comprising a cooling system for the number of power cells.

6. The power cell system according to claim 1, wherein the outer housing is a hermetically sealed structure.

7. The power cell system according to claim 1, further comprising a pressure compensation system.

8. The power cell system according to claim 7, wherein the pressure compensation system comprises a number of openings in at least one power cell housing for regulating the pressure in an interior of the at least one power cell housing according to an ambient pressure.

9. The power cell system according to claim 1, further comprising a number of openings in at least one power cell housing for circulation of a cooling fluid through an interior of at least one power cell of the number of power cells.

10. The power cell system according to claim 9, wherein an opening of the number of openings comprises a filter.

11. The power cell system according to claim 1, further comprising a heat exchanger for cooling an interior of at least one power cell of the number of power cells.

12. The power cell system according to claim 11, wherein the heat exchanger is arranged in a part of one power cell housing.

13. The power cell system according to claim 1, wherein the at least one electronic module comprises a plurality of electronic modules.

14. The power cell system according to claim 1, wherein the power cell system is adapted for deepwater application at subsea levels of 300 meters or deeper.

15. The power cell system of claim 5, wherein the cooling system is a convection cooling system using a fluid.

16. The power cell system according to claim 15, wherein the fluid is a dielectric fluid, a mineral oil, or an ester-based polymer fluid.

17. The power cell system according to claim 16, wherein the fluid is a silicone oil.

* * * * *